United States Patent
Karabed et al.

(10) Patent No.: US 9,419,651 B2
(45) Date of Patent: Aug. 16, 2016

(54) NON-POLYNOMIAL PROCESSING UNIT FOR SOFT-DECISION ERROR CORRECTION CODING

(75) Inventors: Razmik Karabed, San Jose, CA (US); Hakan C. Ozdemir, Los Gatos, CA (US); Vincent Brendan Ashe, Campbell, CA (US); Richard Barndt, San Diego, CA (US)

(73) Assignee: STMICROELECTRONICS, INC., Coppell, TX (US)

( * ) Notice: Subject to any disclaimer, the term of this patent is extended or adjusted under 35 U.S.C. 154(b) by 883 days.

(21) Appl. No.: 12/651,386

(22) Filed: Dec. 31, 2009

(65) Prior Publication Data

US 2010/0174954 A1 Jul. 8, 2010

Related U.S. Application Data

(60) Provisional application No. 61/142,038, filed on Dec. 31, 2008.

(51) Int. Cl.
*H03M 13/15* (2006.01)
*G11B 20/18* (2006.01)
*H03M 13/37* (2006.01)
*H03M 13/45* (2006.01)

(52) U.S. Cl.
CPC ....... *H03M 13/1515* (2013.01); *G11B 20/1833* (2013.01); *H03M 13/373* (2013.01); *H03M 13/451* (2013.01); *G11B 2020/1836* (2013.01); *G11B 2220/2516* (2013.01)

(58) Field of Classification Search
CPC .................. H03M 13/1515; G11B 2020/1836
USPC ............................................................ 88/780
See application file for complete search history.

(56) References Cited

U.S. PATENT DOCUMENTS

| | | | | |
|---|---|---|---|---|
| 4,099,160 A | * | 7/1978 | Flagg | 714/785 |
| 5,604,752 A | * | 2/1997 | Iwamura | 714/785 |
| 6,460,160 B1 | * | 10/2002 | Classon | 714/791 |
| 6,553,536 B1 | * | 4/2003 | Hassner et al. | 714/780 |
| 6,662,338 B1 | | 12/2003 | Rezzi et al. | |
| 7,278,086 B2 | * | 10/2007 | Banks et al. | 714/784 |
| 7,328,395 B1 | * | 2/2008 | Burd | 714/780 |

(Continued)

OTHER PUBLICATIONS

Taipale, D.J.; Seo, M.J.; , "An efficient soft-decision Reed-Solomon decoding algorithm," Information Theory, IEEE Transactions on , vol. 40, No. 4, pp. 1130-1139, Jul. 1994.*

*Primary Examiner* — Steve Nguyen
(74) *Attorney, Agent, or Firm* — Allen, Dyer, Doppelt, Milbrath & Gilchrist, P.A.

(57) ABSTRACT

A system and method for correcting errors in an ECC block using soft-decision data. In an embodiment, a soft-decision ECC decoding method, uses "soft" data indicative of how reliable bits of data are when read out. Such a method may use an update module for receiving and manipulating the soft-decision data and iteratively change bits or groups of bits based upon an ordering of the reliability factors. Then a calculator module may determine the total number of errors still remaining after each iteration. Determining just the total number of errors instead of the actual locations is far less computationally intensive, and therefore, many combination of potential flip-bit combination may be analyzed quickly to determine if any combination might reduce the total number of errors enough to be handled by the conventional hard-decision ECC decoding method.

24 Claims, 4 Drawing Sheets

(56) References Cited

U.S. PATENT DOCUMENTS

| | | | |
|---|---|---|---|
| 7,444,582 B1 * | 10/2008 | Au et al. | 714/784 |
| 7,454,690 B1 * | 11/2008 | Au et al. | 714/780 |
| 7,634,706 B1 * | 12/2009 | Chen et al. | 714/760 |
| 2004/0010748 A1 | 1/2004 | Ozdemir | |
| 2004/0010749 A1 | 1/2004 | Ozdemir | |
| 2006/0248430 A1 * | 11/2006 | Iancu et al. | 714/755 |
| 2010/0169746 A1 | 7/2010 | Karabed | |
| 2010/0174969 A1 | 7/2010 | Ashe | |

* cited by examiner

NON-POLYNOMIAL PROCESSING UNIT FOR SOFT-DECISION ERROR CORRECTION CODING

PRIORITY CLAIM TO PROVISIONAL PATENT APPLICATION

This patent application claims priority to U.S. Provisional Patent Application No. 61/142,038 entitled 'NON-POLYNOMIAL PROCESSING UNIT FOR SOFT-DECISION ERROR CORRECTION CODING' filed on Dec. 31, 2008 and is hereby incorporated by reference.

BACKGROUND

A data-communications system, such as a computer disk drive or a cell phone, includes a read channel, which recovers data from a received read signal (sometimes called a data signal) by interpreting a stream of bits. Such systems may read and write data to and from storage mediums and/or communication channels at ever-increasing rates. With the increase in data throughput, software and hardware may need to be more and more resilient to noise-induced errors. Thus, many communication and computer systems employ error-checking data processing that may be both hardware and software based in order to recover data if noise-induced errors arise.

BRIEF DESCRIPTION OF THE DRAWINGS

Embodiments of the subject matter disclosed herein will become more readily appreciated as the same become better understood by reference to the following detailed description, when taken in conjunction with the accompanying drawings.

DETAILED DESCRIPTION

Figure 1:
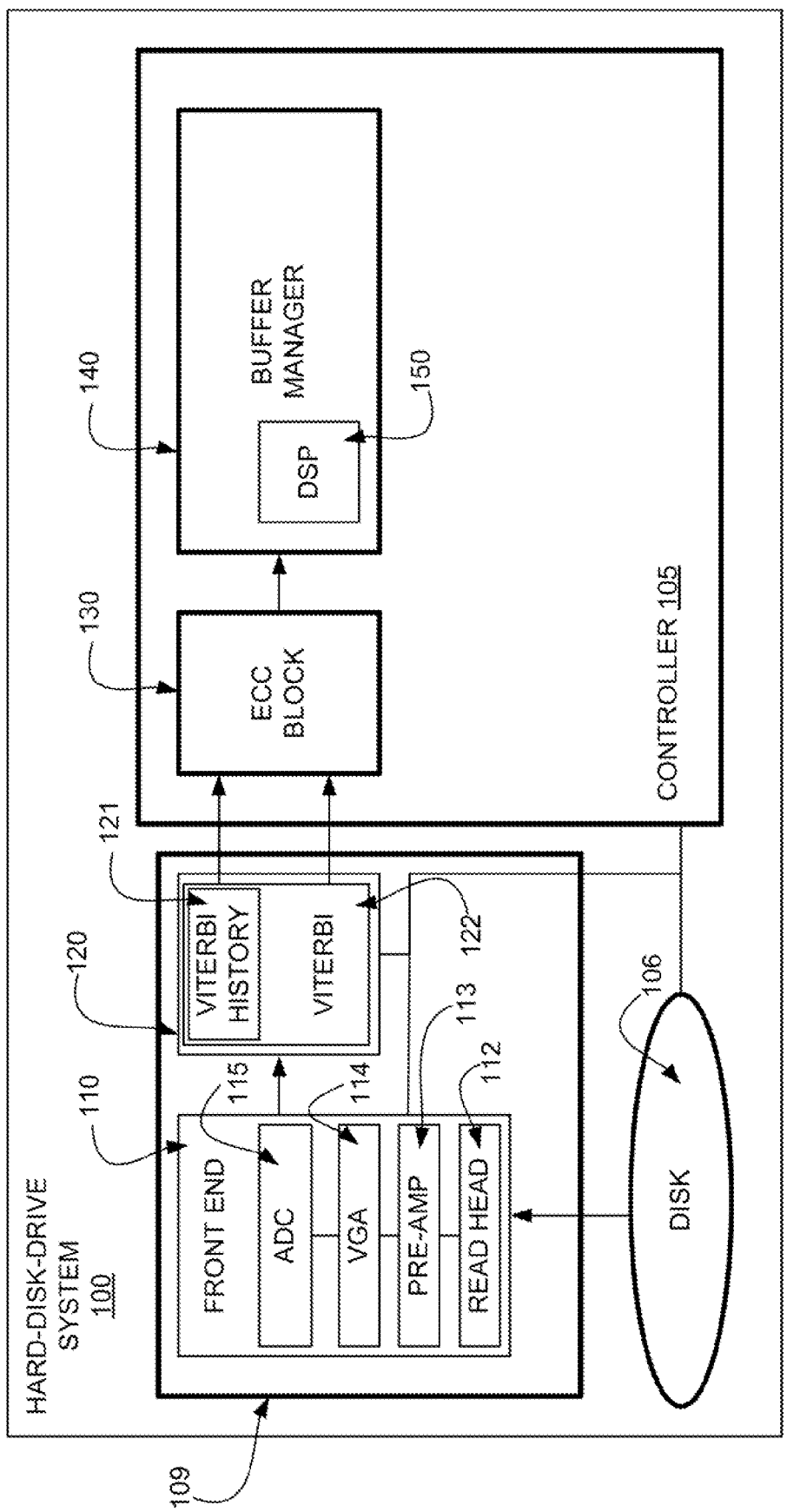
FIG. 1 is a block diagram of an embodiment of a hard-disk-drive system that may use soft data for error-checking.

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Error Correction Coding (ECC) is a method wherein errors during the reading of data may be corrected through statistical interpolation of the data itself when coded in a known manner. For example, in a computer system having a hard-disk drive, when the computer system (i.e., a host system for the hard-disk system) writes data to or reads data from the disk, the data may be checked for errors that may arise due to noise and inter-symbol interference (ISI). In specific, during a read data process, errors in reading the data may occur from various problems that may be encountered in the read channel of a disk drive system. Such errors may cause one or more bits to be read out incorrectly; e.g., the read channel may interpret a bit as "0" when the bit should be "1" and vice versa.

Error Correction Coding (ECC) may be implemented as a function of statistical interpolation based on the data as it is read as well as other meta-data that is stored with the functional data from a storage medium. ECC is a mathematically-intensive process, but may greatly increase the reliability of data being read from a medium. As such, with the increased ability of hard-drive systems and other communications systems to transmit and receive data at greater speeds, improvements in ECC may complement the ability of such systems as well.

Hard-disk drive (HDD) systems and communication channels may use an ECC module to attempt to correct errors that may arise due to reading data incorrectly due to external noise within a particular system. BCH codes (as generally based upon the error correction coding algorithms developed by Bose and Ray-Chaudhiri—in which the acronym BCH derives from these inventor's names) allow algebraic syndrome decoding to be used to find and fix bit-reading errors. One particular BCH coding schema is Reed-Solomon (RS) coding. RS Coding is a form of the general BCH code wherein bits of data are grouped into symbols rather than being handled as individual bits. Generally speaking, sometimes the number of errors present in the symbols of the RS code are too numerous to fix using conventional methods.

Prior to discussing the figures and by way of initial overview, a summary of the subject disclosed herein is presented. Conventional methods for correcting errors in RS codes utilize a hard-decision decoding method wherein any errors are attempted to be corrected on a sector-by-sector basis. Thus, for a given sector of data (e.g., 512 bytes of data, for example), each RS code symbol should correspond to a coefficient in a polynomial that describes the entire sector. If errors arise, then at least one symbol will not correspond to any coefficient in this polynomial and therefore an error is identified. Conventional methods for dealing this error (as well as additional identified errors) involve using a Berlekamp-Messey algorithm to identify the location of the errors in the sector and a Chien-Forney search engine to correct the identified errors. As is discussed in greater detail below, this conventional method for dealing with errors may be referred to as hard-decision ECC decoding.

Depending on how many errors there are in a sector, the hard-decision ECC decoding method may be able to correct all errors. An ECC code can be designed to correct any number of errors in a given sector. The number of corrections is determined by a generator polynomial, which defines the number of ECC parity symbols and their values given a particular sector of user data. A drawback of any ECC code is that the ECC parity symbols are redundant; i.e. they need to be stripped off after any ECC is done. However, the parity symbols need to be initially written to disk (or transmitted in a wireless communications system), even if the user data is received with no errors. This results in loss of valuable hard disk space and/or bandwidth.

In an example, the number of errors that may be corrected is 20. If more than 20 errors are present, the then hard-decision ECC decoding method cannot solve for all errors and a soft-decision ECC decoding method may then be attempted.

In a soft-decision ECC decoding method, additional "soft" data indicative of how reliable data is when read out may be used to identify particular symbols with a higher likelihood of error and then change these symbols first. In an embodiment, a soft-decision ECC decoding path may include a reliability checker operable to receive bits of data read from a data store and operable to associate a reliability factor with each bit of data. Then, an update module may iteratively change bits or groups of bits based upon an ordering of the reliability factors. As each attempt (i.e., flipping of unreliable bits) is made, the update module may determine just the total number or errors still remaining (as opposed to identifying the actual symbols with errors as is done via the Berlekamp-Messey algorithm). An advantage of soft decoding method is that it increases the correction capability of the ECC block without having increase the number of parity symbols.

Determining just the total number of errors instead of the actual locations is far less computationally intensive, and therefore, many combination of potential flip-bit combination may be analyzed quickly to determine if any combination might reduce the total number of errors enough to be handled by the conventional hard-decision ECC decoding method. That is, if the total number of errors is less than the correction capability of the Chien-Forney search engine, then the particular combination of flipping of unreliable bits may be realized and the overall sector may be corrected again using the hard-decision ECC decoding path again. Details regarding the hard-decision ECC decoding and the soft-decision ECC decoding are discussed in greater detail with respect to FIGS. 1-3.

FIG. 1 is a block diagram of a hard-disk-drive (HDD) system 100 according to an embodiment of the subject matter disclosed herein. Such an HDD system 100 may read data from a hard disk 106 or write data to the hard disk. For the purposes of soft-decision decoding of ECC, only the read operation of the HDD 100 is discussed herein.

Generally speaking, the HDD 100 may include a read channel 109 that may read data from a disk 106 and then pass read data through an ECC block 130 to a buffer manager 150 before eventually being passed along to a host computer (not shown). Each of these components may be controlled by a local HDD controller 105. Further, a skilled artisan will understand that these components (with the exception of the disk 106) may be disposed on a single integrated circuit die, individual integrated circuit dies or any combination of dies thereof. Each of these components is discussed further in the following paragraphs.

When data is to be read from a disk 106, a read head 112 that is part of a front end 110 interprets signals detected on the disk 106 to produce a stream of bits to be sent to a read data path. The front end 110 may include amplification and processing circuitry that assists with reading of data stored on the disk 106. Such circuitry may include pre-amplifier 113, a variable-gain amplifier (VGA) 114, and an analog-to-digital converter (ADC) 115. The read head 112 and pre-amplifier 113 convert the data stored on the disk 106 into an analog read signal, and the VGA 114 adjusts the amplitude of the analog read signal to a predetermined value or range of values deemed suitable for the subsequent components of the read circuit 120. The ADC 115 samples the gain-adjusted analog read signal and converts the analog read signal into a digital read signal that may then be passed to the read circuit 120. As was discussed earlier, noise and inter-symbol interference (ISI) may cause read errors wherein bits of data are affected when being read. Such noise-induced errors may be passed to the read circuit 120.

The read circuit 120 includes several data processing components such as filters and the like (not all are shown) for interpreting the read signal. Generally speaking, data read from the disk 106 may be stored and processed in groupings of eight or ten bits (or other suitable grouping numbers) depending on the RS code being employed. A grouping of bits may be referred to as an ECC symbol wherein a sector of data (comprising 512 bytes of data, for example) may include approximately 410 ECC symbols. These ECC symbols are used for error correction as discussed further below.

The read circuit 120 then interprets signals from the front end 110 on a bit-by-bit basis to reconstruct the symbols of the RS codeword. One component for accomplishing this interpretation is a Viterbi detector 122 that includes a path-history exchange block 121. The Viterbi detector 122 processes the sampled digital read signal to produce a signal comprising a stream of bits having definitive logical values representing "1" or "0". An example of a Viterbi detector that may be the same as or similar to the Viterbi detector 122 is disclosed in U.S. Pat. No. 6,662,338 and U.S. Publication Nos. 2004/0010749 and 2004/0010748, which are incorporated by reference. To help the reader understand the present application better, a brief overview of the operation of the Viterbi detector 122 is presented in the following paragraphs.

A Viterbi detector 122 "recovers" data stored on the disk 106 from the digitalized samples of the read signal generated by the read head 112. Assuming the stored data is binary data, the read head 112 senses one or more bits at a time as the surface of the disk 106 spins, and generates a series of sense voltages that respectively correspond to the sensed bits. This series of sense voltages composes the read signal, which consequently represents these sensed data bits in the order in which the read head 112 sensed them.

Unfortunately, because the disk 106 spins relatively fast with respect to the read head, the read signal is not a clean logic signal having two distinct levels that respectively represent logic 1 and logic 0. Instead, the read signal is laden with noise and ISI, and thus more closely resembles a continuous analog signal than a digital signal. Using a sample clock (not shown), the front end 110 samples the read signal at points that correspond to the read head 112 being aligned with respective bit storage locations on the surface of the disk. The ADC 115 digitizes these samples, and generally, a signal-conditioning block (e.g., the VGA 114 and ADC 118) adjusts the gain and timing of these samples and further equalizes these samples, before passing them to the Viterbi detector 122. The Viterbi detector 122 generates a sequence of bit values that is the most likely interpretation of the sequence of bit values stored on the disk 106. The manner in which the most likely interpretation is determined is discussed further.

In determining the output data sequence of the Viterbi detector 122, a dynamic programming detection algorithm (i.e., a Viterbi algorithm) may be used to determine the most probable interpretation of the signals from the front end 110 by passing possible interpretations through various "paths" of a state machine. (Although called a state machine here, those skilled in the art understand that such a reference is made for ease of understanding as the iterations of various dynamic calculations may be software-based and not embodied in any traditional state machine.) As is discussed in greater detail in the aforementioned U.S. Pat. No. 6,662,338, each bit is deterministically calculated by analyzing previous and subsequent bits with respect to the bit being analyzed. Such a calculation determines a "cost" (in term of computational iterations) of determining a logic value of a read bit of data. Thus, the Viterbi algorithm continuously calculates the cost of determining a logical state, and the value of each bit is determined by choosing the least costly path to that bit. The least costly path is the most likely interpretation of the actual bit. It is this most likely determination that is sent to the output of the Viterbi detector 122.

Assuming a noiseless read signal and binary stored data, the read circuit 120 may actually generate digitized read-signal samples having no errors. With such a noiseless environment, the cost of the correct path (correct bit sequence)

would be zero, thereby indicating that the likelihood of the correct interpretation is at a maximum. However, as noise and ISI is introduced, different bits may be read incorrectly. In a hard-decision ECC decoding method, only the least costly path (i.e., most likely interpretation) is used for determining the output for each bit. However, as is discussed below, a soft-decision ECC decoding method may use additional information about how the Viterbi algorithm decision was reached.

In a soft-decision ECC decoding method, the relative proximity of the "distance" difference between the most likely path and the second most likely path is an indication of the reliability of dynamic determination, e.g., a reliability factor indicative of how reliable the hard decision is. For example, in the noiseless environment the correct path has a cost of "0", indicating the strongest likelihood that the bit is interpreted correctly. However, as noise is becomes a factor, the correct (transmitted) sequence (path) accumulates error, thus making its cost nonzero. In some cases the noise can increase the cost of the correct path so much that a different (wrong) path with less cost can be selected by the Viterbi algorithm, leading to an error in the detection. The magnitude of the difference in cost of arriving at a decision for a bit is an indication of the reliability of the dynamic determination of the state machine. As this difference decreases, it becomes less likely that the interpretation of the bit is correct.

This difference may be stored in a register (not shown) in the path history exchange block 121 to calculate reliability which is used in the ECC block 130 as discussed below with respect to FIG. 2. The Viterbi detector 122 may then send the estimated data sequence (e.g., a data sequence based solely upon the hard decisions of the Viterbi algorithms) to an ECC block 130 for error checking. Once errors (if any) have been corrected, the data sequence may be sent to a buffer manager 140 for additional digital signal processing (DSP 150). Aspects of the ECC block 130 and the hard-decision and soft-decision ECC methods are described below with respect to FIGS. 2 and 3.

Figure 2:
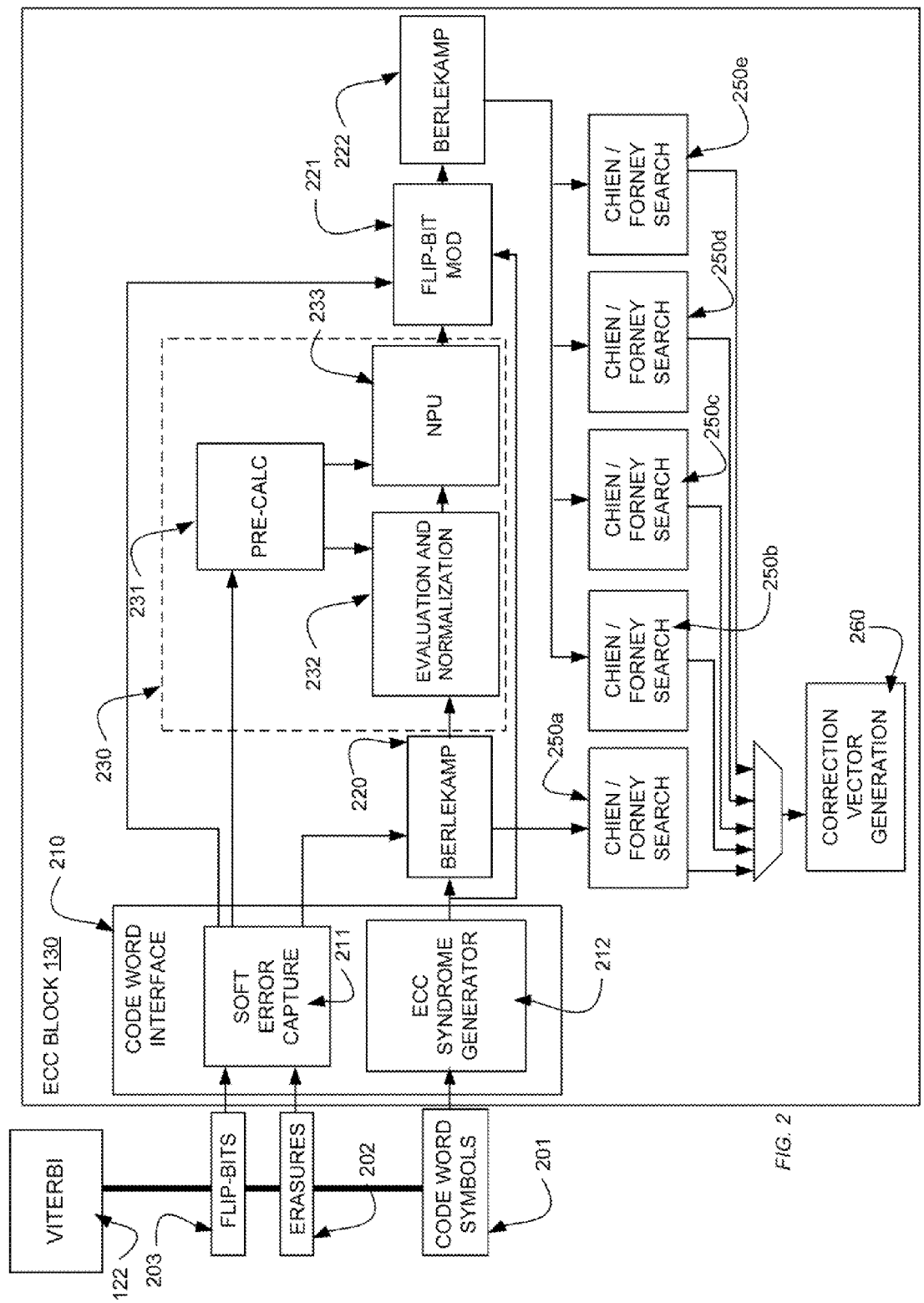
FIG. 2 is a block diagram of an embodiment of an error-code correction block (ECC) that may be part of the controller of FIG. 1.

FIG. 2 is a block diagram of an ECC block 130 according to an embodiment of the subject matter disclosed herein. As before with respect to FIG. 1, only aspects of a read channel and read operation are discussed with respect to FIG. 2. The ECC block 130 may be a functional computing block having program modules for accomplishing the computations and tasks described. Alternatively, aspects of the ECC block 130 may also be hardware-based logic such that computations and tasks are accomplished without use of a processor or by processing instructions. Further, the various components described herein may comprise any combination of hardware or software based modules disposed on one or more integrated circuits.

The ECC block 130 receives data from the read circuit (120 of FIG. 1) in three different manners at a code word interface 210. Depending on the nature of the received data, the code word interface 210 includes different modules for manipulating the data into a format for providing an error-code checking schema. The actual data sequence as interpreted by the hard decisions of the Viterbi detector 122 may be sent in the form of code word symbols 201. Soft data, i.e., the reliability information of the received data is used to identify most likely error events in the detected data sequence. Soft-decision data may be sent to the code word interface 210 in the form of flip-bit identifications 203 and erasure identification 202. The reliability information as used in a soft-decision ECC method is discussed further below after a discussion about the hard-decision ECC method involving just the hard decisions of the Viterbi detector 122.

The code word symbols 201 may be a RS-coded series of bits comprising ten-bit symbols of data within a disk sector as read from the disk. Errors may be checked and corrected on a sector-by-sector when reading data from the disk (106 of FIG. 1). In one embodiment, sectors comprise 512 or 1024 bytes of data. As such, each symbol in the code word symbols 201 may be coded into ten-bit symbols. Different embodiments may use different lengths for symbols, such as an eight-bit length in one other embodiment. Any bit-length for symbols may be used, but for the purposes of this example, a ten-bit symbol is used. Therefore, if one reads one data sector (which may be 512 bytes, for this example), the data sector may have about 410 ten-bit symbols representing the user data in the data sector.

Further, the read channel 109 (FIG. 1) may also have an ECC encoder (not shown) that adds ECC parity symbols to provide error correction capability. In an embodiment, RS encoding used in HDD systems may add a number of parity symbols that is twice the error-correction capability T (e.g., the number of errors the ECC block may handle when only using a hard-decision ECC decoding method) of the ECC block 130. For example, if the error-correction capability T is 20, corresponding to a correction capability of 20 symbols, there will be 40 ECC parity (also called ECC redundancy) symbols. These parity symbols are typically written immediately after the user data in the sector of data. Thus, for T=20, and 410 user data symbols, a total of 450 symbols will be read from the disk for each sector.

After the Viterbi detector sends its hard-decisions on the individual bits read from the disk to the ECC block 130, this 450-symbol grouping of bits may then be used to generate a syndrome at the ECC syndrome generator 212. As syndromes representing a sector of data are computed, they are passed to a Berlekamp algorithm block 220. The Berlekamp algorithm block 220 generates an error-locator polynomial $\sigma(x)$ that is a polynomial which has roots at the error locations of the received data stream (which is a RS codeword). After the error-locator polynomial $\sigma(x)$ is generated, the first 250a of five Chien-Forney search engines may be used to find the roots and error magnitude by brute force in a hard-ECC decoding method. Depending on the actual number of errors identified, i.e., the degree of the error-locator polynomial $\sigma(x)$, the first Chien-Forney search engine may or may not be able to correct the specific errors with the sector. If the number of the errors is less than the error-correction capability T of the ECC block 130, then the Chien-Forney search engine 250a will be able to find and correct all the errors. If the number of errors is greater than error-correction capability T, then this Chien-Forney search engine 250a will not be able to find the roots, and will indicate a decoding failure.

As such, if the degree of the initial error-locator polynomial $\sigma(x)$ that was generated by the first Berlekamp algorithm block 220 is less than a threshold (e.g., 20 errors for example) for the Chien-Forney search engine 250a, any remaining soft-ECC decoding may not be necessary. However, as the number of erroneous symbols exceeds the error-correction capability T, the hard-decision ECC decoding method fails. Thus, in addition to the hard-decision ECC decoding in this path as just discussed, a soft-decision ECC decoding path may also be employed for attempting to correct symbol errors by methods beyond the hard-decision ECC decoding method.

In a soft-decision ECC method, additional reliability information from the Viterbi detector about the detected bits may also be used in the ECC decoding process. The soft-decision ECC method may be used in an ECC block 130 concurrent with or after a conventional hard-decision ECC method.

The soft-decision ECC method is based on a concept referred to as reliability. Reliability may be a mathematical determination based on a logarithmic likelihood ratio (LLR). A system and method for using the LLR is 16 described in copending U.S. patent application Ser. No. 12/651,399, filed Dec. 31, 2009 entitled "LOW-COMPLEXITY SOFT-DECISION DECODING OF ERROR-CORRECTION CODES" and is herein incorporated by reference.

The reliability information from the Viterbi detector 122 may be used to identify and list the least reliable bit locations that correspond to the most likely error events and most likely locations for erasures. This list may be sent to the code word interface 210 as a stream of flip-bit data 203 from the path-history exchange block 121 (FIG. 1) of the Viterbi detector 122. Here, a soft-error capture block 211 passes this information to a soft-ECC block 230 that may be part of the overall ECC block 130. The soft-ECC block 230 may then use this list to iteratively attempt to correct errors using the initial (hard-decision) error-locator polynomial of the first Berlekamp algorithm block 220. As is discussed below, the size of this list affects the computation complexity and processing time, as all combinations of the error events need to be tested.

Further, the soft-error capture block 211 may also receive data from the Viterbi detector 122 about erasures 202 in the sector. An erasure may be the location of an error event that could not be confidently identified via the Viterbi algorithm. As such, bits of this nature may be identified as an erasure and handled differently within the ECC-block 130. Such erasure data may be passed to the hard-decision ECC decoding path to the first Berlekamp algorithm block 220 as well as to the soft-decision ECC decoding path. Handling of such erasure data within the ECC block 130 and specifically within a Berlekamp algorithm 17 block 220 is the subject of related U.S. patent application Ser. No. 12/651,392, filed Dec. 31, 2009, entitled "ERROR-LOCATOR-POLYNOMIAL GENERATION WITH ERASURE SUPPORT" and is hereby incorporated by reference. Other than using the degree of the erasures (i.e., the number of erasures identified), no further discussion of erasures is discussed herein.

Focusing back to the soft-ECC block 230, a pre-calculation block 231 may organize the error event list as received. This pre-calculation block 231 creates an ordering of the bits associated with each LLR from least reliable to most reliable. As may be the case, several bits may have the same LLR. Therefore, these bits with the same LLR may be grouped together as a flip word of an arbitrary length. As groupings of bits are associated by LLR rank and organized into flip words, the flip words may then be ordered according the flip word's reliability and iteratively changed according to a Grey code ordering method.

The soft-ECC block 230 includes two additional components. These components are an evaluation and normalization block 232 for initializing the data received at the soft-ECC block 230 and a non-polynomial Berlekamp update unit (NPU) 233 which is described in greater detail below. As briefly discussed in the summary section above, the soft-ECC block 230 attempts combination after combination of flip-word bit flipping in an effort to find a combination that may be handled by an available Chien-Forney search engine 250a-250e. These components, together with the grey-code ordered list of flip words may iteratively find a particular bit-flip pattern in which enough errors in the sector are corrected such that any remaining errors may be handled by the other components of the overall ECC block 130.

Ultimately then, the soft-ECC block 230, and in particular the NPU 233, is comparing the remaining identified errors in any given sector, referred to as the degree D (which is the sum of the number of roots of the error-locator polynomial $\sigma(x)$ as generated by the first Berlekamp algorithm block 220 and the total number of identified erasures) to the error-correction capacity T of the total number of errors in which the hard-ECC method may effectively handle. If D is less than T for a given comparison, then a particular bit-flip combination is a candidate for a hard-ECC correcting using an available Chien-Forney engine 250b-250e.

In an iterative manner then, the NPU block 233 may flip one flip-word at a time. After flipping each bit in the flip-word, the NPU 233 may determine whether or not the degree D is less than the error-correction capacity T. This is accomplished by determining only the degree of a new error-locator polynomial $\sigma(x')$ as modified by the fact that the bits of one flip-word have been changed. The mathematical operation of the NPU 233, as will be described in greater detail with respect to FIG. 3 below, is far less computationally intensive than the that of the above-described Berlekamp algorithm because the NPU 233 only determines the degree D of a new error-locator polynomial $\sigma(x')$ and not its actual coefficients. As a result, combination after combination of flip-word flips may be quickly evaluated prior to attempting computationally intensive portions of the hard-decision ECC decoding method. Thus, only candidate combinations that meet the criteria of D<T may be sent out of the soft-ECC block 230 for an attempt at hard-decision ECC decoding.

As candidates are identified (e.g., flip-word combinations that meet the criteria D<T), the particular pattern of flip bits may be sent to a flip-bit modification block 221. Together with the initial syndromes and erasure identifications, new syndromes may be created with the particular flip bits changed as identified by the soft-ECC block 230. Then the new syndromes may be sent to a second Berlekamp algorithm block 222. The second Berlekamp algorithm block 222 (much like the first one 220) generates an error-locator polynomial $\sigma(x)$ that is now correctable with less roots than the error-correction capability T. The identified symbols (e.g., coefficients) of the error locator polynomial $\delta(x)$ may then be used by one of the other four 250b-e Chien-Forney search engines in a hard-ECC decoding method.

Each Chien-Forney search engine 250a-250e may simultaneously attempt to solve the identified errors given a particular syndrome and error-locator polynomial $\sigma(x)$. That is, as candidate combinations of flip words are identified and sent from the soft-ECC block 230, up to four candidates may be attempted at the same time in Chien-Forney search engines 250b-250e. (The first one 250a is reserved for the initial hard-ECC method using the first Berlekamp algorithm block 220.) Thus, if any one of the Chien-Forney search engine 250a-250e solves for all sector errors, then the solution is passed to a correction vector generation block 260 that generates a new corrected sequence of bits to pass along to the buffer manager 140 (FIG. 1). Once a solution is found, any remaining search currently still executing is halted and flushed. A mathematical example of using soft data for an ECC method may be better understood with reference to FIG. 3.

Figure 3:
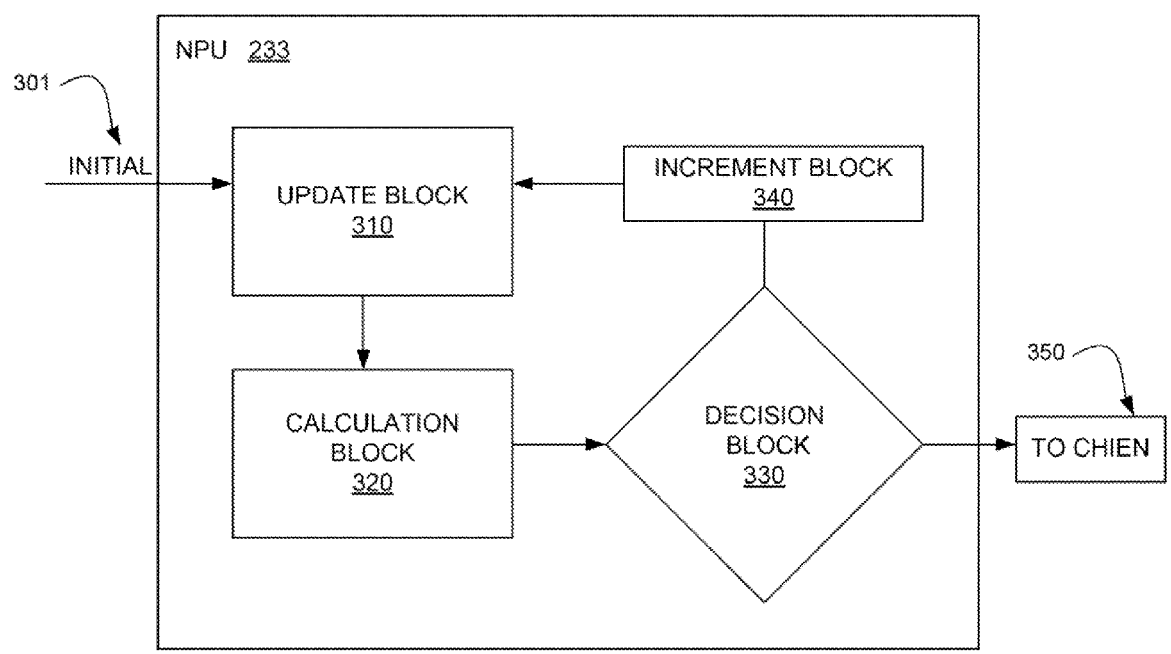
FIG. 3 is a block diagram of a non-polynomial update unit (NPU) that may be part of the ECC block of FIG. 2.

FIG. 3 is a block diagram of a NPU 233 that may be part of the ECC block of FIG. 2. The NPU 233 includes modules for accomplishing the mathematical operations and comparisons for determining whether or not particular flip-word bit flip combinations meet a specific criterion (e.g., D<T) for attempting a hard-ECC decoding method (e.g., A Chien-Forney search). These modules are an update block 310, a calculation block 320, an increment block 340, and a decision block 330. When a soft-ECC method is first invoked, a set of initial polynomials 301 may be seeded to the NPU 233. These initial polynomials are generated by the first Berlekamp algorithm block 220 and include an initial error-locator polynomial σ(x) and an auxiliary polynomial τ(x). The error-locator polynomial σ(x) and the auxiliary polynomial τ(x) may be generated using an inversionless Dual Line Blahut algorithm. Such a generation process is described in greater detail in copending U.S. patent application Ser. No. 12/651,392, filed Dec. 31, 2009, entitled "ERROR-LOCATOR-POLYNOMIAL GENERATION WITH ERASURE SUPPORT" and is herein incorporated by reference. Then the gradient polynomial Δ(x) may be defined as:

$$\Delta(x)=d/dx[\sigma(x)\cdot\tau(x)]$$

The initial gradient polynomial Δ(x) as well as the initial degree D may be calculated at the evaluation and normalization block 232 (FIG. 2). Then all four of these parameters may be passed to the NPU 233 for iterative manipulation.

At first pass, the update block 310 may change the first of the ordered flip-words to attempt the first candidate combination. After the first flip, a calculation block 320 may determine the new degree D of the newly changed syndrome. Again, this calculation only determines the number of roots in a potential new error-locator polynomial σ(x) as opposed to actually determining the coefficients of the roots (as may be accomplished in a Berlekamp algorithm). Then, at decision block 330, a comparison is made of the newly generated degree D to the error-correction capacity T. If D<T, then this particular flip-word combination is determined to be a correctable combination 350 and the combination is passed along to an available Chien-Forney search engine. If, however, D=T or D>T, then the next flip-word combination may be tried.

As such, a grey code counter is incremented at an increment block 340 and the process repeats by flipping another flip-word and calculating another new degree D. The calculation of the second and subsequent degrees, however, is less computationally intensive because the change from one combination to the next is known and therefore, only the gradient polynomial Δ(x) changes from iteration to iteration. Thus, the new degree of a new error-locator polynomial σ(x) may be calculated from only the new gradient polynomial Δ(x). In this capacity, the mathematical computations necessary to evaluate all potential flip-word combinations is greatly reduced as new error-locator polynomials σ(x) need not be calculated at each iteration.

The NPU algorithm as used in the calculation block 320 can be summarized in the series of equations outlined in the following equations:

$$a_1 = \sigma_k(X_i^{-1})$$

$$b_1 = \tau_k(X_i^{-1})$$

$$c_1 = \Delta_k(X_i^{-1})$$

$$\mu_1 = X_i Y_i a_i b_i$$

$$\mu_2 = X_i Y_i a_i^2$$

$$\mu_3 = X_i Y_i b_i^2$$

$$\beta_1 = Y_i c_i + \theta_k X_i^{1-K}$$

$$\Delta = (\sigma')(\tau)+(\sigma)(\tau')$$

Where $a_1$, $b_1$, and $c_1$ are the values of σ, τ, and Δ at the flip locations respectively. $Y_i$ is the magnitude associated with the flip and Δ may be used to determine the degree of an error-locator polynomial without having to rely upon the actual polynomials, but rather just the values of the polynomials as discussed above. The NPU algorithm uses the current degree of the error-locator polynomial σ along with the values of μ, τ, and β at the flip locations to calculate the values of the polynomials as well as the new degree of the error-locator polynomial σ. The following table summarizes the possible conditions upon which different hardware units will be deployed to calculate the necessary values. In this table, msel denotes a selector, which selects a particular algorithm to calculate next value of D ($D_{k+1}$) based on the current degree and conditions listed. K is related to the correction capability T and number of erasures: K=T−2 (number of erasures)

|  | Condition | $D_{k+1}$ | msel |
|---|---|---|---|
| $D_k < K/2$ | $a_i \ne 0$ | $D_k + 1$ | 0 |
|  | $a_i = 0$ & $\beta \ne 0$ | $D_k$ | 2 |
|  | $a_i = 0$ & $\beta = 0$ | $D_k - 1$ | 1 |
| $D_k = K/2$ | $a_i \ne 0$ & $\beta = 0$ | $D_k + 1$ | 0 |
|  | $a_i = 0$ & $\beta \ne 0$ | $D_k$ | 2 |
|  | $a_i = 0$ & $\beta = 0$ | $D_k - 1$ | 1 |
|  | $a_i \ne 0$ & $\beta \ne 0$ | $D_k$ | 3 |
| $D_k > K/2$ | $b_i = 0$ & $\beta = 0$ | $D_k + 1$ | 0 |
|  | $b_i = 0$ & $\beta \ne 0$ | $D_k$ | 2 |
|  | $b_i \ne 0$ | $D_k - 1$ | 1 |

With these parameters, the error-locator polynomials σ(x) and the auxiliary polynomial τ(x) may be calculated at non-flip locations as follows by using four update polynomials A(z), B(z), P(z) and Q(z):

| msel | A(z) | B(z) | P(z) | Q(z) |
|---|---|---|---|---|
| 0 | $1 + X_i^2 z^2$ | 0 | $(\beta + u_0) + \beta X_i z$ | $u_1$ |
| 1 | $u_2$ | $\beta X_i z + (\beta + u_0) X_i^2 z^2$ | 0 | $1 + X_i^2 z^2$ |
| 2 | $\beta + \beta X_i z$ | $u_1 X_i z$ | $u_2$ | $\beta + \beta X_i z$ |
| 3 | $\beta + (\beta + u_0) X_i z$ | $u_1 X_i z$ | $b_i + b_i X_i z$ | $a_i + a_i X_i z$ |

Because the syndrome is a finite field, selecting a Galois Field of $g=1+X_i z$, the above equations can be rewritten as follows:

| msel | A(z) | B(z) | P(z) | Q(z) |
|---|---|---|---|---|
| 0 | $g^2$ | 0 | $\beta g + u_0$ | $u_1$ |
| 1 | $u_2$ | $\beta g X_i z + u_0 X_i^2 z^2$ | 0 | $g^2$ |
| 2 | Bg | $u_1 X_i z$ | $u_2$ | Bg |
| 3 | $Bg + u_0 X_i z$ | $u_1 X_i z$ | $b_i g$ | $a_i g$ |

Therefore, the error-locator polynomials σ(x) and the auxiliary polynomial τ(x) may be calculated using the four update polynomials as follows:

$$\sigma_{k+1}(X_i^{-1}) = \left.\frac{A(z)\sigma_k(z) + B(z)\tau_k(z)}{g}\right|_{z=X_i^{-1}}$$

$$\tau_{k+1}(X_i^{-1}) = \left.\frac{P(z)\sigma_k(z) + Q(z)\tau_k(z)}{g}\right|_{z=X_i^{-1}}$$

Similarly, the gradient polynomials Δ(x) may be calculated at non-flip locations with various conditions as follows:

| msel | $a_0$ | $b_0$ | $c_0$ | $\theta_{k+1}$ |
|---|---|---|---|---|
| 0 | $\beta X_i$ | 0 | $u_1$ | $\theta_k u_1$ |
| 1 | 0 | $\beta X_i$ | $u_2$ | $\theta_k u_2$ |
| 2 | $\beta X_i u_2$ | $\beta X_i u_1$ | $\beta^2$ | $\theta_k \beta^2$ |
| 3 | $a_i X_i u_2$ | $a_i X_i u_1$ | $\beta a_i$ | $\theta_k a_i \beta$ |

Thus, the gradient polynomials $\Delta(x)$ may be calculate depending on which msel: For msel=0 or 1, then $$\Delta_{k+1}(X_i^{-1}) = a_0\sigma_k^2(z) + b_0\tau_k^2(z) + c_0\Delta_k(z)|z = X_i^{-1}$$

For msel=2 or 3, then $$\Delta_{k+1}(X_i^{-1}) = \frac{a_0\sigma_k^2(z) + b_0\tau_k^2(z) + c_0\Delta_k(z)}{g^2}\bigg|_{z=X_i^{-1}}$$

Finally, the error-locator polynomial $\sigma(x)$, the auxiliary polynomial $\tau(x)$ and the gradient polynomial $\Delta(x)$ may be calculated as follows at the flip locations:

| msel | $\sigma_{k+1}$ | $\tau_{k+1}$ | $\Delta_{k+1}$ |
|---|---|---|---|
| 0 | 0 | $\theta_k a_i X_i^{1-K}$ | $\theta_k a_i^2 X_i^{2-K}$ |
| 1 | $\theta_k b_i X_i^{1-K}$ | 0 | $\theta_k b_i^2 X_i^{2-K}$ |
| 2 | $\theta_k a_i X_i^{1-K}$ | $\theta_k b_i X_i^{1-K}$ | $\theta_k c_i X_i^{1-K}$ |
| 3 | $\theta_k a_i X_i^{1-K}$ | 0 | $\theta_k c_i X_i^{1-K}$ |

With the iterative nature of the calculations of these polynomials at each pass and with only one parameter changing—the one flip-word change that is next in the grey code ordering—then additional computational savings may be realized by sharing arithmetic resources for calculations that can be assumed to not change for a particular iteration. For example, in a method involving eight identied flip-words having eight different LLR values. Only one word at a time can change when grey code ordered. Therefore, calculation involving non-changing flip-words may be disregarded for at least one iteration and likely several iterations for some flip words (e.g., the most reliable of the eight identified flip words). As such, by rearranging the Galois field multipliers and adder with respect to flip locations and non-flip locations, arithmetic resources may be shared because some input terms will be constant depending on the number of identified flip words. Thus, the following table shows an allocation of resources when only seven arithmetic units are used (as opposed to eight if no resources are shared):

| | Index of the Flip Location (i) | | | | | | | |
|---|---|---|---|---|---|---|---|---|
| Other Locations (j) | 0 | 1 | 2 | 3 | 4 | 5 | 6 | 7 |
| 0 | $\overline{U}$ | U0 | U0 | U0 | U0 | U0 | U0 | U0 |
| 1 | U0 | $\overline{U}$ | U1 | U1 | U1 | U1 | U1 | U1 |
| 2 | U1 | U1 | $\overline{U}$ | U2 | U2 | U2 | U2 | U2 |
| 3 | U2 | U2 | U2 | $\overline{U}$ | U3 | U3 | U3 | U3 |
| 4 | U3 | U3 | U3 | U3 | $\overline{U}$ | U4 | U4 | U4 |
| 5 | U4 | U4 | U4 | U4 | U4 | $\overline{U}$ | U5 | U5 |
| 6 | U5 | U5 | U5 | U5 | U5 | U5 | $\overline{U}$ | U6 |
| 7 | U6 | U6 | U6 | U6 | U6 | U6 | U6 | $\overline{U}$ |

With only seven arithmetic units (U0-U6), the polynomial values at the non-flip locations may be completed in only $2^8$ iterations (as opposed to $2^{10}$). Thus, the arithmetic units are dynamically allocated as the grey code counter is incremented to take advantage on non-changing non-flip locations. Sharing of arithmetic units further allows for a reduced area for implementation on an integrated circuit since fewer arithmetic units are needed.

Figure 4:
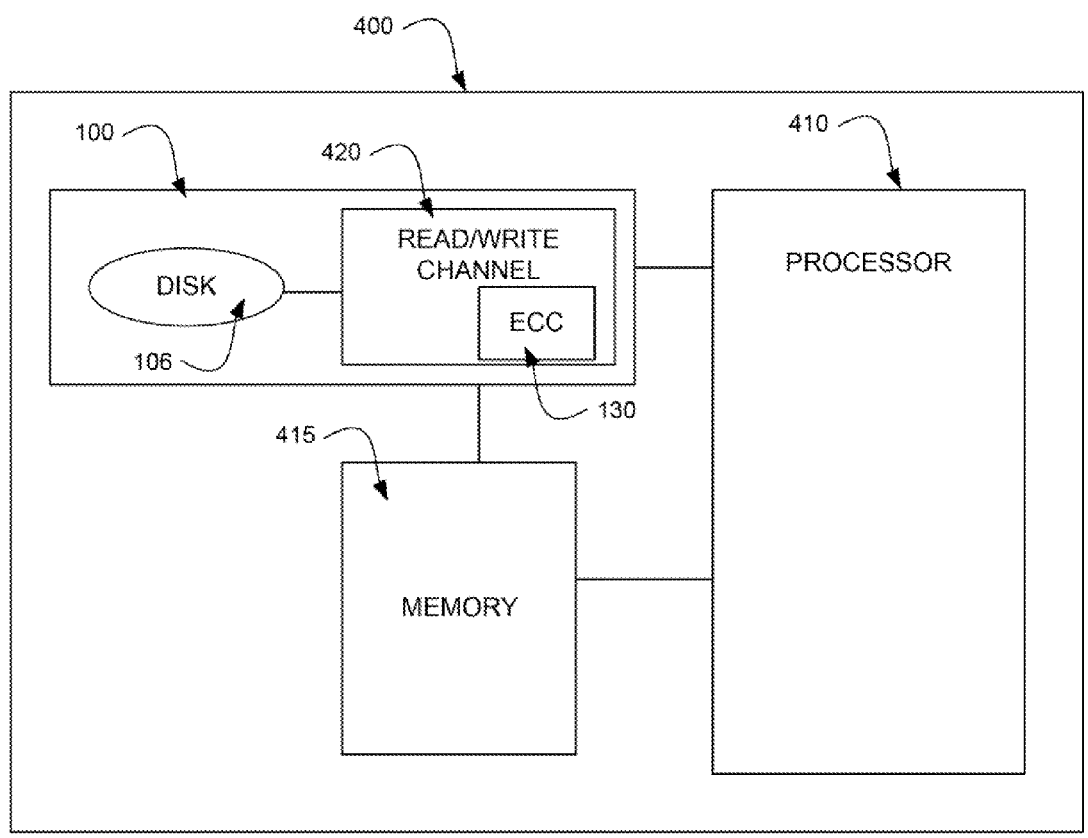
FIG. 4 is a block diagram of an embodiment of a computer system that may implement the HDD of FIG. 1 and the ECC block of FIG. 2.

FIG. 4 is a block diagram of an embodiment of a computer system 400 that may implement the HDD system 100 of FIG. 1 and the ECC block 130 of FIG. 2. In this system embodiment, the system 400 may include a processor 410 coupled to a local memory 415 and coupled to the HDD system 100. As can be seen, the HDD system 100 includes a hard disk 106 and a read/write channel 420 having an ECC bock 130. The processor 410 may be operable to control the memory 415 and the HDD system 100 in transferring data to and from the disk 106 and to and from the memory 415. Further, additional data stores and communication channels (not shown) may be used to transfer data to and from the HDD system 100 that may be remote from this computer system 400.

Such a computer system may be any number of devices including a CD player, a DVD player, a Blu-Ray player, a personal computer, a server computer, a smart phone, a wireless personal device, a personal audio player, media storage and delivery system or any other system that may read and write data to and from a storage medium or communication channel.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. An error-correcting module comprising:
   error correction circuitry configured to
      receive soft-decision data about a stream of bits, the soft-decision data indicative of potential bit errors and comprising an error polynomial and an auxiliary polynomial,
      calculate a gradient polynomial based upon a gradient between the error polynomial and the auxiliary polynomial,
      determine a number of errors in the stream of bits by determining a number of roots in the error polynomial without determining coefficients of the error polynomial,
      when the determined number of errors is greater than an error-correction capacity, iteratively changing the stream of bits, and iteratively determining a new number of errors in the changed stream of bits based upon only an updated gradient polynomial, and
      when the determined number of errors is less than the error-correction capacity, send the stream of bits for error-correction.

2. The error-correcting module of claim 1 wherein said error correction circuitry is configured to manipulate the soft decision data by at least changing at least one bit of data from a current logic state to a different logic state.

3. The error-correcting module of claim 1 wherein said error correction circuitry is configured to manipulate the soft decision data by at least iteratively changing a series of bits of data according to a grey code schema.

4. The error-correcting module of claim 1 wherein the error correction circuitry is configured to determine a number of errors in the stream of bits based upon determining a difference between a first finite field and a second finite field, each finite field defined by the soft-decision data.

5. The error-correcting module of claim 1 wherein the error polynomial and the auxiliary polynomial define a plurality of polynomials; and wherein the error correction circuitry is configured to:
  evaluate the plurality of polynomials using bit locations identified as a flip location; and
  evaluate the plurality of polynomials differently using bit locations identified as non-flip locations.

6. The error-correcting module of claim 1 wherein the error polynomial, the auxiliary polynomial, and the gradient polynomial are derived from a sector of data coded as a Reed-Solomon code.

7. A controller comprising:
  a buffer manager; and
  an error control circuit coupled to said buffer manager and configured to
    receive soft-decision data about a stream of bits, the soft-decision data indicative of potential bit errors and comprising an error polynomial and an auxiliary polynomial,
    calculate a gradient polynomial based upon a gradient between the error polynomial and the auxiliary polynomial,
    determine a number of errors in the stream of bits by determining a number of roots in the error polynomial without determining coefficients of the error polynomial,
    when the determined number of errors is greater than an error-correction capacity, iteratively changing the stream of bits, and iteratively determining a new number of errors in the changed stream of bits based upon only an updated gradient polynomial, and
    when the determined number of errors is less than the error-correction capacity, send the stream of bits for error-correction.

8. The controller of claim 7 wherein said buffer manager and said error control circuit are carried by a single integrated circuit.

9. The controller of claim 7 wherein said buffer manager and said error control circuit are carried by separate integrated circuits.

10. The controller of claim 7 wherein said error control circuit is configured to manipulate the soft decision data by at least changing at least one bit of data from a current logic state to a different logic state.

11. The controller of claim 7 wherein said error control circuit is configured to manipulate the soft decision data by at least iteratively changing a series of bits of data according to a grey code schema.

12. The controller of claim 7 wherein the error control circuit is configured to determine a number of errors in the stream of bits based upon determining a difference between a first finite field and a second finite field, each finite field defined by the soft-decision data.

13. A hard-disk drive system comprising:
  a storage medium;
  a read head configured to read data from the storage medium; and
  an error-code correction module configured to
    receive soft-decision data about a stream of bits from said read head, the soft-decision data indicative of potential bit errors and comprising an error polynomial and an auxiliary polynomial,
    calculate a gradient polynomial based upon a gradient between the error polynomial and the auxiliary polynomial,
    determine a number of errors in the stream of bits by determining a number of roots in the error polynomial without determining coefficients of the error polynomial,
    when the determined number of errors is greater than an error-correction capacity, iteratively changing the stream of bits, and iteratively determining a new number of errors in the changed stream of bits based upon only an updated gradient polynomial, and
    when the determined number of errors is less than the error-correction capacity, send the stream of bits for error-correction.

14. The hard-disk drive system of claim 13 wherein said error-code correction module is configured to manipulate the soft decision data by at least changing at least one bit of data from a current logic state to a different logic state.

15. The hard-disk drive system of claim 13 wherein said error-code correction module is configured to manipulate the soft decision data by at least iteratively changing a series of bits of data according to a grey code schema.

16. The hard-disk drive system of claim 13 wherein the error-code correction module is configured to determine a number of errors in the stream of bits based upon determining a difference between a first finite field and a second finite field, each finite field defined by the soft-decision data.

17. A computer system comprising:
  a processor; and
  a hard-disk drive system coupled to said processor and comprising
    a storage medium,
    a read head configured to read data from the storage medium, and
    an error-code correction module configured to
      receive soft-decision data about a stream of bits from said read head, the soft-decision data indicative of potential bit errors and comprising an error polynomial and an auxiliary polynomial,
      calculate a gradient polynomial based upon a gradient between the error polynomial and the auxiliary polynomial,
      determine a number of errors in the stream of bits by determining a number of roots in the error polynomial without determining coefficients of the error polynomial,
      when the determined number of errors is greater than an error-correction capacity, iteratively changing the stream of bits, and iteratively determining a new number of errors in the changed stream of bits based upon only an updated gradient polynomial, and
      when the determined number of errors is less than the error-correction capacity, send the stream of bits for error-correction.

18. The computer system of claim 17 wherein said error-code correction module is configured to manipulate the soft decision data by at least changing at least one bit of data from a current logic state to a different logic state.

19. The computer system of claim 17 wherein said error-code correction module is configured to manipulate the soft decision data by at least iteratively changing a series of bits of data according to a grey code schema.

20. The computer system of claim 17 wherein the error-code correction module is configured to determine a number of errors in the stream of bits based upon determining a difference between a first finite field and a second finite field, each finite field defined by the soft-decision data.

21. A method for error correcting comprising:
operating error correction circuitry for receiving soft-decision data about a stream of bits, the soft-decision data indicative of potential bit errors and comprising an error polynomial and an auxiliary polynomial;
operating the error correction circuitry for calculating a gradient polynomial based upon a gradient between the error polynomial and the auxiliary polynomial;
operating the error correction circuitry for determining a number of errors in the stream of bits by determining a number of roots in the error polynomial without determining coefficients of the error polynomial;
operating the error correction circuitry for when the determined number of errors is greater than an error-correction capacity, iteratively changing the stream of bits, and iteratively determining a new number of errors in the changed stream of bits based upon only an updated gradient polynomial; and
operating the error correction circuitry for when the determined number of errors is less than the error-correction capacity, sending the stream of bits for error-correction.

22. The method of claim 21 further comprising operating the error correction circuitry for manipulating the soft decision data by at least changing at least one bit of data from a current logic state to a different logic state.

23. The method of claim 21 further comprising operating the error correction circuitry for manipulating the soft decision data by at least iteratively changing a series of bits of data according to a grey code schema.

24. The method of claim 21 further comprising operating the error correction circuitry for determining a number of errors in the stream of bits based upon determining a difference between a first finite field and a second finite field, each finite field defined by the soft-decision data.

* * * * *